US008615692B1

(12) United States Patent
Khurana et al.

(10) Patent No.: US 8,615,692 B1
(45) Date of Patent: Dec. 24, 2013

(54) METHOD AND SYSTEM FOR ANALYZING TEST VECTORS TO DETERMINE TOGGLE COUNTS

(75) Inventors: Rajesh Khurana, Noida (IN); Krishna Chakravadhanula, Vestal, NY (US); Vivek Chickermane, Ithaca, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 148 days.

(21) Appl. No.: 12/637,935

(22) Filed: Dec. 15, 2009

(51) Int. Cl.
*G01R 31/28* (2006.01)

(52) U.S. Cl.
USPC .......................................... 714/726; 702/60

(58) Field of Classification Search
None
See application file for complete search history.

(56) References Cited

U.S. PATENT DOCUMENTS

| | | | |
|---|---|---|---|
| 5,481,469 A * | 1/1996 | Brasen et al. | 702/60 |
| 5,668,732 A * | 9/1997 | Khouja et al. | 702/60 |
| 6,219,305 B1 * | 4/2001 | Patrie et al. | 368/113 |
| 6,442,720 B1 * | 8/2002 | Koprowski et al. | 714/726 |
| 6,728,920 B1 * | 4/2004 | Ebersman | 714/752 |
| 6,959,426 B2 * | 10/2005 | Xiang et al. | 716/103 |
| 7,277,803 B2 * | 10/2007 | Thirunavukarasu et al. | 702/57 |
| 7,370,299 B2 * | 5/2008 | Huang et al. | 716/109 |

OTHER PUBLICATIONS

Najm, F.N.; , "A survey of power estimation techniques in VLSI circuits," Very Large Scale Integration (VLSI) Systems, IEEE Transactions on , vol. 2, No. 4, pp. 446-455, Dec. 1994.*
Chi-Ying Tsui; Monteiro, J.; Massoud Pedram; Srinivas Devadas; Despain, A.M.; Lin, B.; , "Power estimation methods for sequential logic circuits," Very Large Scale Integration (VLSI) Systems, IEEE Transactions on , vol. 3, No. 3, pp. 404-416, Sep. 1995.*
Schneider, P.H.; Senn, M.A.; Wurth, B.; , "Power analysis for sequential circuits at logic level," Design Automation Conference, 1996, with EURO-VHDL'96 and Exhibition, Proceedings EURO-DAC '96, European , vol., no., pp. 22-27, Sep. 16-20, 1996.*
Li-Pen Yuan; Sung-Mo Kang; , "A sequential procedure for average power analysis of sequential circuits," Low Power Electronics and Design, 1997. Proceedings., 1997 International Symposium on , vol., no., pp. 231-234, Aug. 18-20, 1997.*
Sankaralingam, R. et al., "Static Compaction Techniques to Control Scan Vector Power Dissipation", VLSI Test Symposium, 2000 18th IEEE.
Farid N. Najm, "A Survey of Power Estimation Techniques in VLSI Circuits", from IEEE Journal, pp. 446-455, IEEE Transactions on Very Large Scale Integration(Vlsi) Systems, vol. 2, No. 4, Dec. 1994.
Kokorady et al., "Static Verification of Test Vectors for IR Drop Failure", ICCAD 2003, pp. 760-764.
Ahmed et al., "Transition Delay Fault Test Pattern Generation Considering Supply Voltage Noise in a SOC Design", DAC 2007, pp. 533-538.
Ranganathan Sankaralingam et al., "Static Compaction Techniques to Control Scan Vector Power Dissipation", 2000, Computer Engineering Research Center Department of Electrical and Computer Engineering, University of Texas, Austin, TX.

* cited by examiner

*Primary Examiner* — Steve Nguyen
(74) *Attorney, Agent, or Firm* — Vista IP Law Group, LLP

(57) ABSTRACT

A system, method, and computer program product is disclosed that recycle digital assertions for analyzing the test vectors to quickly and accurately calculate the switching activity at each test clock pulse or scan cycle. According to some approaches, load vector data and unload vector data are analyzed to determine toggle counts and switching activity, without requiring simulation to be performed.

30 Claims, 17 Drawing Sheets

Fig. 3

| Flops | a | b | c | d | pad bit 1 | Pad bit 2 | Load Toggles | Unload Toggles | Total Toggles |
|---|---|---|---|---|---|---|---|---|---|
| Load vector | 1 | 0 | 0 | 1 | 1 | 0 | | | |
| Unload vector cycle 0 | 1 | 1 | 0 | 1 | | | | | |
| Cycle 1 | 0 | 1 | 1 | 0 | | | 1 | 2 | 3 |
| Cycle 2 | 1 | 0 | 1 | 1 | | | 2 | 1 | 3 |
| Cycle 3 | 1 | 1 | 0 | 1 | | | 2 | 0 | 2 |
| Cycle 4 | 0 | 1 | 1 | 0 | | | 3 | 0 | 3 |
| Cycle 5 | 0 | 0 | 1 | 1 | | | 2 | 0 | 2 |
| Cycle 6 | 1 | 0 | 0 | 1 | | | 2 | 0 | 2 |
| Total Flop Toggles | 4 | 3 | 4 | 4 | | | | | |

Fig. 5

| Scan Cycle Number (A) | Load Vector (B) | Cumm. Toggle Count (C) | Subtract (D) | New cumm. Count (E) | First Bit Toggle (F) | Total Load Toggles (G) |
|---|---|---|---|---|---|---|
| 1 | 0 | 0 | 0 | 0 | | 1 |
| 2 | 1 | 1 | 0 | 1 | 1 | 2 |
| 3 | 1 | 1 | 0 | 1 | 1 | 2 |
| 4 | 0 | 2 | 0 | 2 | 1 | 3 |
| 5 | 0 | 2 | 0 | 2 | 0 | 2 |
| 6 | 1 | 3 | 1 | 2 | 0 | 2 |

Fig. 7

| Scan Cycle Number (H) | Unload Vector (I) | Cumm. Toggle Count (J) | Total Unload Toggles (K) |
|---|---|---|---|
| 1 | 1 | 0 | 2 |
| 2 | 1 | 0 | 1 |
| 3 | 0 | 1 | 0 |
| 4 | 1 | 2 | 0 |

Fig. 9

| Scan Cycle Number (A) | Load Vector (B) | Cumm. Toggle Count (C) | First Bit Toggle (D) | New cumm. Count (E) | Reverse Cumm. Count (F) |
|---|---|---|---|---|---|
| 1 | 0 | 0 | 1 | 1 | 4 |
| 2 | 1 | 1 | 1 | 2 | 3 |
| 3 | 1 | 1 | 1 | 2 | 3 |
| 4 | 0 | 2 | 1 | 3 | 2 |
| 5 | 0 | 2 | 1 | 3 | 2 |
| 6 | 1 | 3 | 1 | 4 | 1 |

Fig. 10

| Scan Cycle Number (H) | Unload Vector (I) | Cumm. Toggle Count (J) |
|---|---|---|
| 1 | 1 | 0 |
| 2 | 1 | 0 |
| 3 | 0 | 1 |
| 4 | 1 | 2 |

Fig. 11

| Flop (G) | Load Vector Reverse Cumm count (F) | Unload vector Cumm. Count (J) | Total Flop Toggles (K) |
|---|---|---|---|
| a | 4 | 0 | 4 |
| b | 3 | 0 | 3 |
| c | 3 | 1 | 4 |
| d | 2 | 2 | 4 |

Fig. 12

| Flops | a | b | c | d | pad_bit_1 | pad_bit_2 |
|---|---|---|---|---|---|---|
| Load vector | 1 | 0 | 0 | 1 | 1 | 0 |
| Unload vector | 1 | 1 | 0 | 1 | | |
| Cycle 1 | 0 | 1 | 1 | 0 | | |
| 2 | 1 | 0 | 1 | 1 | | |
| 3 | 1 | 1 | 0 | 1 | | |
| 4 | 0 | 1 | 1 | 0 | | |
| 5 | 0 | 0 | 1 | 1 | | |
| 6 | 1 | 0 | 0 | 1 | | |
| Total At-One Count | 3 | 3 | 4 | 4 | | |

Fig. 14

| Scan Cycle Number (A) | Load Vector (B) | Cumm. At-One Count (C) | Reverse Cumm. At-One Count (D) |
|---|---|---|---|
| 1 | 0 | 0 | 3 |
| 2 | 1 | 1 | 2 |
| 3 | 1 | 2 | 2 |
| 4 | 0 | 2 | 2 |
| 5 | 0 | 2 | 1 |
| 6 | 1 | 3 | 0 |

Fig. 15

| Scan Cycle Number (H) | Unload Vector (I) | Cumm. At-One Count (J) |
|---|---|---|
| 1 | 1 | 1 |
| 2 | 1 | 2 |
| 3 | 0 | 2 |
| 4 | 1 | 2 |

Fig. 16

| Flop (F) | Load Vector Reverse At-One count (D) | Unload vector Cumm. Count (J) | Total At-One Count (K) |
|---|---|---|---|
| a | 3 | 1 | 3 |
| b | 2 | 2 | 3 |
| c | 2 | 2 | 4 |
| d | 2 | 2 | 4 |

METHOD AND SYSTEM FOR ANALYZING TEST VECTORS TO DETERMINE TOGGLE COUNTS

FIELD

The invention relates to the field of electrical design and testing.

BACKGROUND AND SUMMARY

Automated Testing Equipment (ATE) tools are devices often used to test electronic designs, such as designs of integrated circuit (IC) or application specific integrated circuit (ASIC) products. Scan-based testing is one method of using ATE devices, in which scan logic allows an internal sequential element of the IC, such as a flip-flop, to be to be controlled and observed during testing. Chains of flip-flops (or "flops") are connected as "scan chains", and when testing is performed, test vector data that is applied through the scan chain control the sequential state of the flip-flops. After application of the test vector, the response of the scan chains is shifted out of the flip-flops and compared against expected responses to determine whether or not the IC is functioning correctly.

The length of a test vector is equal to the length of longest scan chain, and a test clock is pulsed as many times as the longest scan chain length. This causes the flip-flops in the scan chain to shift bit by bit as the test vector value is applied through it. This shifting of test vectors causes flip-flops in the scan chain to toggle between logic 0 to 1 or between 1 and 0.

The toggle activity in the flip-flop is a major component for dissipating power on the IC. Therefore, an increase in the number of toggles during testing will translate into higher average test power during the scan-based test. This is significant, since higher average test power may cause thermal hot-spots, which can result in false defects due to thermal imbalance conditions on the IC chip.

An increase in localized switching can also result in higher peak test power, which causes IR drops in the power-grid during execution. This can create false defects due to unfactored IR drop conditions on the IC chip and can also cause burn out on the IC chip in extreme cases. Moreover, increased Average and Peak Test Power could result in false defects or yield loss, wherein a good chip is classified as bad chip.

The present invention is directed to approaches to accurately and efficiently calculate the switching activity (or "toggle count") when test vectors are applied during manufacturing tests on ATE devices. By accurately calculating the number of flip-flops that toggles during each test clock cycle, one can estimate the power dissipation during testing activity. The toggle count information also helps in predicting power hot-spots on the chip.

One possible approach to calculate toggle information during testing is to perform scan shift simulation. For each scan clock pulse in the simulation, the vector is shifted bit by bit through the scan chain and the current content of the scan chain is shifted out via the scan chain output. These actions are performed for each scan cycle to obtain the simulation results. The main limitation of scan shift simulation approach is its excessive run time, since the run-time for this approach is almost proportional to the square of the length of the scan chain.

Another possible approach is to compare the power dissipated by two test vectors, such as the technique described in Sankaralingam et al., "Static Compaction Techniques to Control Scan Vector Power Dissipation", VLSI Test Symposium, 2000 18th IEEE. This technique assigns weights to transitions in scan vectors based on their position in the chain. The weight assigned to a transition is the difference between the size of the scan chain and the position in the vector in which the transition occurs. The longer a transition travels through the scan chain before it reaches the scan out, the higher the switching activity. Then a sum of weighted transitions is calculated to estimate scan power of a test vector. The test vector with higher sum of weighted transitions is deemed to be dissipating higher test power.

The main limitation with this approach is that it calculates test power by analyzing test vectors using gross estimates, and therefore does not provide accurate toggle counts for each scan cycle. This approach does not account for scan chain structure in the design, the unbalanced scan chains and the padding bits, and it also does not account for presence of inverters in the scan chains. In addition, this technique cannot provide the load and unload toggle count at each test clock pulse and does not provide the total number of toggles in each flop. Moreover, this technique does not account for toggles that occur in overlapped scan due to shifting of unload bit from the unload vector and loading of load bit from the load vector. Therefore, this technique only provides a first order estimate of power dissipated by a scan vector and does not provide the actual transitions count per test clock cycle.

Embodiments of the present invention provide an improved approach for analyzing the test vectors to quickly and accurately calculate the switching activity at each test clock pulse (scan cycle). Without any degradation in quality of results, embodiments of the present invention significantly reduce the run time as compared to the existing approach than does an explicit scan shift simulation. According to some embodiments, load vector data and unload vector data are analyzed to determine toggle counts and switching activity, without requiring simulation to be performed.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

FIG. 3 illustrates test data and example simulation results.

FIG. 5 illustrates an example table for performing load toggle analysis according to some embodiments of the invention.

FIG. 7 illustrates an example table for performing unload toggle analysis according to some embodiments of the invention.

FIGS. 9-11 illustrate example tables for performing toggle count analysis according to some embodiments of the invention.

FIG. 12 illustrates test data and example simulation results for performing at-one counts.

FIGS. 14-16 illustrate example tables for performing at-one count analysis according to some embodiments of the invention.

DETAILED DESCRIPTION

The present invention is directed to a system, method, and computer program product which provides an efficient and fast approach for analyzing test vectors to perform toggle analysis of tests.

Figure 1:
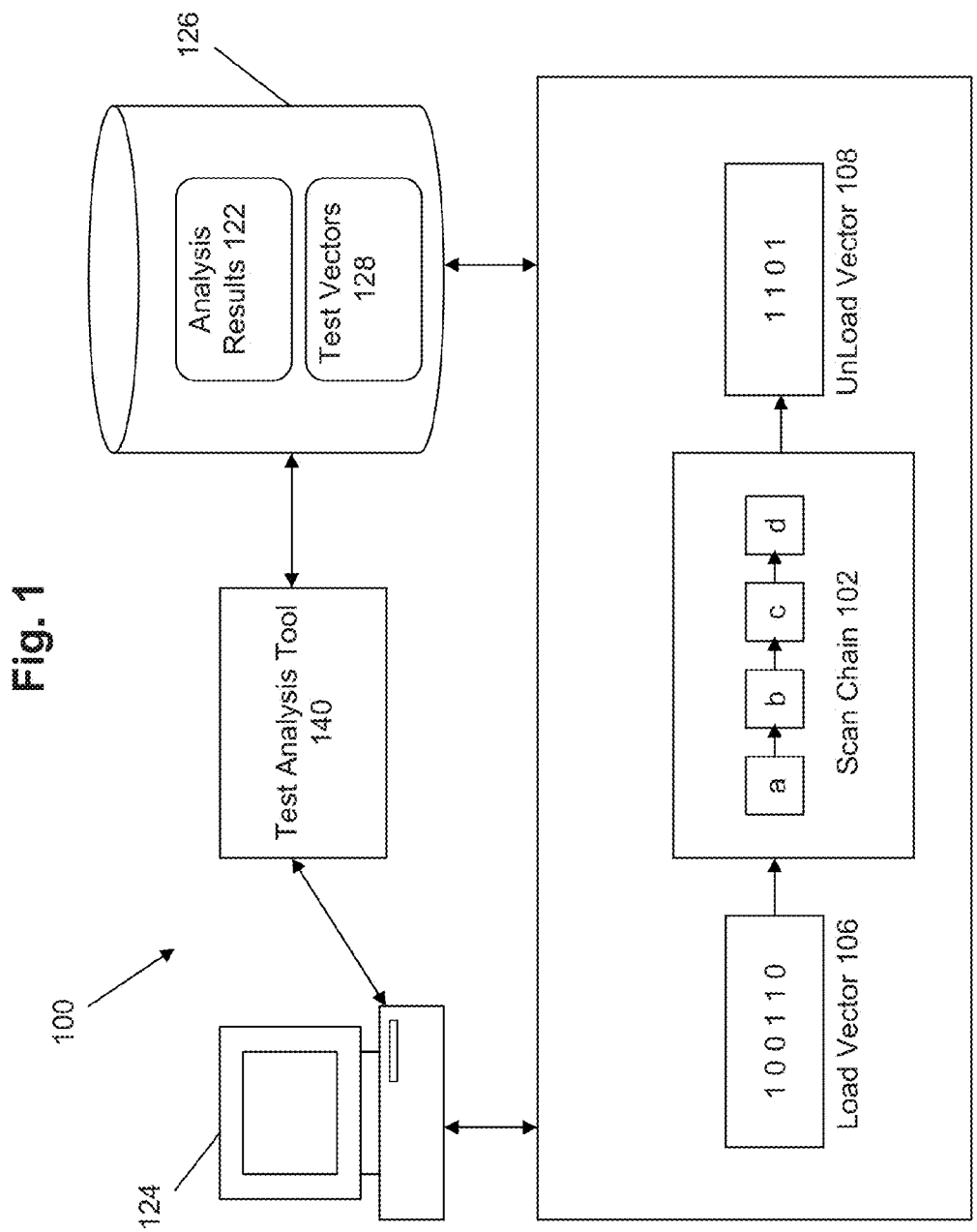
FIG. 1 illustrates an example system which may be employed in some embodiments of the invention to perform toggle analysis.

FIG. 1 illustrates an example system 100 which may be employed in some embodiments of the invention for analyzing test vectors to calculate the switching activity for an electronic design or device. System 100 may include one or more users at one or more user stations 124 that operate the system 100. Such users include, for example, design, test, or verification engineers. User station 124 comprises any type of computing station that may be used to operate, interface with, or implement EDA applications or devices. Examples of such user stations 124 include for example, workstations, personal computers, or remote computing terminals. User station 124 comprises a display device, such as a display monitor, for displaying processing results 122 to users at the user station 124. User station 124 also comprises input devices for user to provide operational control over the activities of system 100.

A computer readable storage device 126 may be used to store analysis results 122 as well as any test vector data used by the system 100. Computer readable storage device 126 comprises any combination of hardware and software that allows for ready access to the data that is located at the computer readable storage device 126. For example, computer readable storage device 126 could be implemented as computer memory operatively managed by an operating system. The computer readable storage device 126 could also be implemented as an electronic database system having storage on persistent and/or non-persistent storage.

A test analysis tool 140 may be used by users a user station 124 to analyze test vectors 128 to calculate the switching activity for an electronic design or device. The test vectors 128 may includes one or more load vectors 106 that are shifted into the flip-flops a, b, c, and d of one or more scan chains 102. The analyzed test vectors 128 may also include unload vectors 108 that are shifted out of the scan chain 102.

According to some embodiments of the invention, toggle analysis is performed by recognizing that the toggles that occur to flip-flops a, b, c, and d of scan chain 102 during the scan phase are due to the load vector 106 and unload vector 108. Therefore, by appropriately analyzing the load vector 106 and unload vector 108, the present embodiments can perform toggle count analysis in a very fast and accurate manner, without the need to perform simulation.

Figure 2:
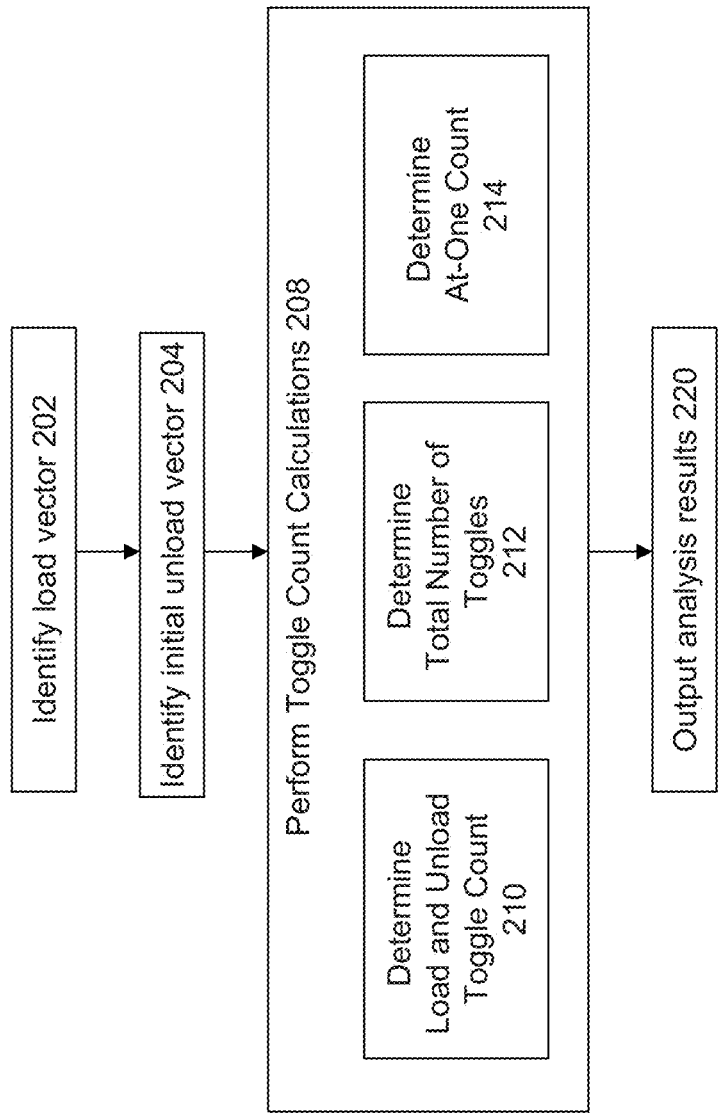
FIG. 2 shows a flowchart of a process for performing toggle analysis according to some embodiments of the invention.

FIG. 2 shows a high level chart of a flow for performing some embodiments of the invention. As noted above, a basic principle behind some embodiments is that the toggles during a scan phase are due to load and unload vectors.

At 202, the process identifies the load vector to be analyzed. The load vector is the test vector that is shifted into the flip-flops of the scan chain. For example, as shown in FIG. 1, the load vector 106 is a sequence of bits "1 0 0 1 1 0" that are shifted one-by-one into the flip-flops a, b, c, and d during testing.

At 204, the process also identifies the unload vectors 108. During each scan cycle, as the bits from the load vector are shifted into the scan chain, the unload vectors would correspond to the bits that are shifted out of the flip-flops in the scan chain. For example, as shown in FIG. 1, the unload vector 108 is a sequence of bits "1 1 0 1" that are shifted one-by-one out of the flip-flops a, b, c, and d during testing.

The process then performs, at 208, toggle count calculations based upon analysis of the load and unload vectors. For example, at 210, the process performs analysis to identify a "load toggle count" and an "unload toggle count". These are the two types of toggles that may occur during a scan cycle, where the load toggle is due to the shifting of the load vector and the unload toggle is due to the shifting of unload the vector through the scan chains. In overlapped scan the scan load and unload are done at the same time in the same clock pulse. One reasons for identifying the unload toggle is to capture the response of a previous test.

Another type of analysis that may be performed is to determine the total number of toggles during a scan shift phase (212). This analysis can be used to determine the total number of toggles at each flip-flop, and for the entire scan chain during the scan shift phase. Yet another type of analysis that may be performed is to determine the "at-one" count for the flip-flops during the scan shift phase (214). This type of analysis identifies the total number of times that a scan chain flip-flop is at a value of "1" during the scan shift phase. This information is often used by power analysis tool to analyze the power consumption of the IC chip.

To illustrate embodiments of the invention, consider the example data shown in FIG. 3. Assume that this example data illustrates the results of shifting the load vector "1 0 0 1 1 0" through a scan chain having flip-flops a, b, c, and d. The unload vectors shown in the figure are the output results shifted from the scan chain which would be compared with expected results to see if the IC is working as expected.

Conventionally, accurate toggle counts can only be obtained for this type of example by performing simulation to obtain the bit values for the scan chain for each of the scan cycles. This is a very expensive process, but one that does provide the exact expected bit values for the scan chain so that toggle counts can be obtained.

The initial unload vector at scan cycle 0 (before shifting in any bits from the load vector) is "1 1 0 1", where flop a has the bit value of "1", flop b has the value of "1", flop c has the value of "0", and flop d has the value of "1". Since this is the initial unload vector, this means that all of the bits in this unload vector at cycle 0 are based upon a previous test vector that was loaded into the scan chain.

When simulation is performed, then it can be observed that during scan cycle 1, the first bit of the load vector (the right-most bit having value "0" in the column marked "pad bit 2") is shifted into the flip-flop a. Therefore, flop a now has a bit value of "0". Since flop a previously had a bit value of "1" in scan cycle 0, this means that a toggle has occurred for flop a in scan cycle 1.

The bit value previously in flip-flop a in cycle 0 is moved to flip-flop b in cycle 1. Therefore, the previous value of flop a ("1") is to be placed into flop b. Since the previous value of flop b ("1") is the same as the current value of flop b ("1"), this means that there is no change in bit value for this flop. Therefore, a toggle does not need to occur for flop b in cycle 1.

The bit value previously in flip-flop b in scan cycle 0 is moved to flip-flop c in cycle 1. Therefore, the previous value of flop b ("1") is now placed into flop c. Since flop c previously had a bit value of "0" in scan cycle 0, this means that a toggle has occurred for flop c in scan cycle 1.

The bit value previously in flip-flop c in scan cycle 0 is moved to flip-flop d in cycle 1. Therefore, the previous value of flop c ("0") is now placed into flop d. Since flop d previously had a bit value of "1" in scan cycle 0, this means that a toggle has occurred for flop d in scan cycle 1.

Therefore, a total of three toggles has occurred in scan cycle 1, to flops a, c, and d. The toggle in flop a is due to the shifting in of a bit from the load vector. As such, the toggle for flop a is a load toggle. The toggles to flops c and d are based upon shifting in bits from values that already existed in the previous unload vector in scan cycle 0 from a previous test. Therefore, since they are based upon a previous test these toggles are considered unload toggles.

Each succeeding bit from the load vector is shifted into the scan chain in the ensuing scan cycles. Thus, in scan cycle 2, the next bit in the load vector (the "1" bit shown in the "pad bit 1" column) is shifted into flop a, with the value of flop b shifted into flop c, and the value in flop c shifted into flop d. In cycle 2, there are a total of three toggles, with flops a, b, and d toggling based upon load toggles in flops a and b, and an unload toggle in flop d. In scan cycle 3, the bit value of the load vector in column "d" is shifted into flop a. In cycle 3, there are a total of two toggles, with flops b and c toggling as load toggles. In scan cycle 4, the bit value of the load vector in column "c" is shifted into flop a. In cycle 4, there are a total of three toggles, with flops a, c, and d all toggling as load toggles. In scan cycle 5, the bit value of the load vector in column "b" is shifted into flop a. In cycle 5, there are a total of two toggles, with flops b and d both toggling as load toggles. In scan cycle 6, the bit value of the load vector in column "a" is shifted into flop a. In cycle 6, there are a total of two toggles, with flops a and c both toggling as load toggles.

Therefore, in this example, there are a total of four toggles for flop a, three toggle for flop b, four toggles for flop c, and four toggle for flop d. There is one load toggle and two unload toggles for cycle 1, two load toggles and one unload toggle for cycle 2, two load toggles for cycle 3, three load toggles for cycle 4, two load toggles for cycle 5, and two load toggles for cycle 6.

While simulation can produce all of this data to obtain the above toggle counts, the simulation process is very costly in terms of time and resources. Embodiments of the present invention permit accurate toggle counts to be obtained without requiring simulation to be performed to generate the full scan cycle data. Instead, the load vector and unload vector data are analyzed to quickly and accurately obtain toggle counts for the scan cycles.

Figure 4:
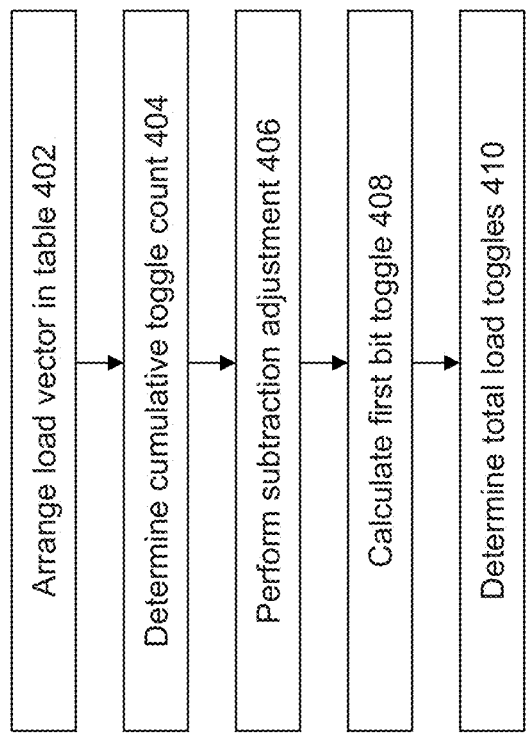
FIG. 4 shows a flowchart of a process for performing load toggle analysis according to some embodiments of the invention.
Figure 6:
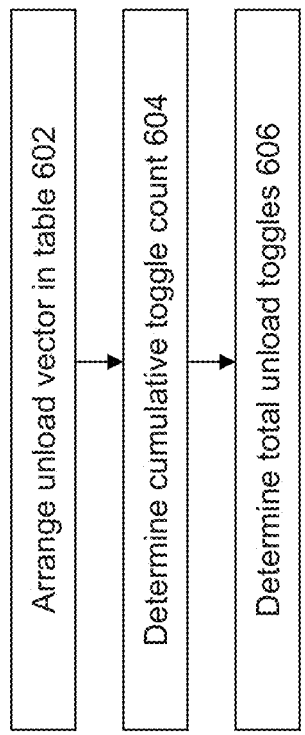
FIG. 6 shows a flowchart of a process for performing unload toggle analysis according to some embodiments of the invention.

FIGS. 4 and 6 show flowcharts of processes for determining total load and unload toggles, respectively, for each scan cycle of a scan cycle. As indicated above, the input data for these processes are the load and unload test vectors for the scan chain. The load vectors include the data that needs to be loaded in each flop of the scan chain and the padding bits in case of unbalanced chain. The length of load vector is equal to the longest scan chain length. The unload vector is the capture response of a previous test.

FIG. 4 illustrates an embodiment of a process for determining total load toggles for each scan cycle. This process is implemented according to the present embodiment by organizing and analyzing the load vector using a tabular structure. Each step of this process is illustrated in the table of FIG. 5, which shows how this process may be applied to obtain the load toggle count for the data of FIG. 3. This table includes a separate row for each scan cycle (the scan cycle number corresponding to each row is in column A).

Referring to 402 of FIG. 4, the process is implemented by arranging the load vector in a column of a table such that the first value is either the padding bit value or the data that needs to be loaded in the last flop of the scan chain. FIG. 5 shows an example table in which the bits of the load vector arranged in order in column B.

Next, at 404, the cumulative toggle count is determined and stored in another column of the table. In the illustrative example of FIG. 5, the cumulative toggle count is stored in column C of the table. Each element in this column corresponds to the cumulative toggle count up to that point in the load vector. The toggle count is incremented whenever there is a transition from 0 to 1 or 1 to 0 in the load vector column B.

For row 1 in the table of FIG. 5, the cumulative toggle count in column C is 0. However, from row 1 to row 2, it can be seen that the bit value in column B toggles from the "0" value in row 1 to the "1" value in row 2. Therefore, the cumulative toggle count in column C for row 2 is incremented from 0 to 1. From row 2 to row 3, the bit value in column B does not toggle since both rows have the bit value "1". Therefore, the cumulative toggle count in column C for row 3 does not increment. From row 3 to row 4, the bit value in column B toggles from the "1" value in row 3 to the "0" value in row 4. Therefore, the cumulative toggle count in column C for row 4 is incremented from 1 to 2. From row 4 to row 5, the bit value in column B does not toggle since both rows have the value of "0". Therefore, the cumulative toggle count in column C for row 5 does not increment. From row 5 to row 6, the bit value in column B toggles from the "0" value in row 5 to the "1" value in row 6. Therefore, the cumulative toggle count in column C for row 6 is incremented from 2 to 3.

At 406 of FIG. 4, the process determines a subtraction adjustment to the toggle counts. For each element that is at a position greater than or equal to the chain length in cumulative toggle count column, an adjustment is obtained by subtracting the current cumulative count by the cumulative toggle count of an element at a position such that the difference between two positions is equal to the chain length (L).

$$\text{Adjusted } C[j]=C[j]-C[j-L] \text{ for } j>L$$

$$\text{Adjusted } C[j]=C[j] \text{ for } j<=L$$

In the example of FIG. 5; the chain length is 4, since there are only four flops (a, b, c, d) in the scan chain. Therefore, the adjustment value placed in column D for the first 4 rows of the table is zero. However, starting at row 5, an adjustment value will be placed in column D. In the present example, the cumulative toggle count at row 1 is 0, therefore a value of 0 will be placed in column D for row 5 (for row 1+chain length). Also the cumulative toggle count at row 2 is 1, and therefore an adjustment value of 1 will be placed in column D for row 6.

The adjustment is performed for each row by subtracting the adjustment value in column D from the cumulative toggle count value in column C. The new cumulative toggle count is then stored in column E. In the present example, only the cumulative toggle count value in row 6 changes since that is the only row having an adjustment value in column D.

Next, at 408, the process calculates a first bit toggle value for each scan cycle row. The first bit toggle value is "1" if the first element in the load vector column toggles with respect to the unload vector value for the first flop in the scan chain. Otherwise, the first bit toggle value is "0". In the vector data for the present example shown in FIG. 3, it can be seen that the first bit toggle value only applies with respect to scan cycle 1 through scan cycle 4, by following the original bit value of "0" from the "pad bit 2" column that is shifted into each flop of the scan chain from cycle 1 through cycle 4. Therefore, in the table of FIG. 5, a value of "1" is placed into the first bit toggle column F of rows 1-4, while a value of "0" is placed into rows 5-6.

At 410, the total load toggle value for each scan cycle is determined by adding the first bit toggle value of column F for each row to the cumulative toggle count value of column E, up to the row corresponding to the chain length.

In the example of FIG. 5, the total toggle count in column G for row 1 is therefore the sum of the value in row E ("0") and the value in column F ("1"), which is a total load toggle value of "1" for scan cycle 1. This calculation similarly performed for each row to obtain the total load toggle count for each scan cycle row, so that the total for scan cycle 2 is "2", the total for row 3 is "2", the total for row 4 is "3", the total for row 5 is "2", and the total for row 6 is "2". The cumulative toggle count column G now contains the load toggle count during each scan cycle. It can be seen that these values exactly match up to the values in the "load toggles" column of the original data set in FIG. 3.

FIG. 6 shows a flowchart for an embodiment of a process for determining total unload toggles for each scan cycle. This process is implemented according to the present embodiment by organizing and analyzing the unload vectors using a tabular structure. Each step of this process is illustrated in the table of FIG. 7, which shows how this process may be applied to obtain the unload toggle count for the data of FIG. 3. This table includes a separate row for each scan cycle (the scan cycle number corresponding to each row is in column H).

At 602, the process arranges the unload vector for scan cycle 0 in a column such that the first value corresponds to the first flop unload value and the last value corresponds to the unload value for last flop. This is shown for the unload vector data of FIG. 3 in column I of FIG. 7.

At 604, the process creates another column for a cumulative toggle count. As before, the cumulative toggle count is incremented whenever there is a transition from 0 to 1 or 1 to 0 in the unload vector column.

For the example of FIG. 7, for row 1 the cumulative toggle count in column J is 0. From row 1 to row 2, the bit value in column I does not toggle since both rows have the bit value "1". Therefore, the cumulative toggle count in column J for row 2 does not increment. However, from row 2 to row 3, it can be seen that the bit value in column I toggles from the "1" value in row 2 to the "0" value in row 3. Therefore, the cumulative toggle count in column J for row 3 is incremented from 0 to 1. From row 3 to row 4, the bit value in column I toggles from the "0" value in row 3 to the "1" value in row 4. Therefore, the cumulative toggle count in column J for row 4 is incremented from 1 to 2.

At 606, the order of the cumulative toggle count column is reversed such that the first value goes into last element and the last value moves into first element. This is illustrated in column K of FIG. 7, in which the value of the first row 1 in column J is moved to the last row 4 in column K. The value of the last row 4 in column J is moved to the first row 1 in column K. The value of the second row 2 in column J is moved to the third row 3 in column K. The value of the third row 3 in column J is moved to the second row 2 in column K.

At this point, the total unload toggle count column K now contains the unload toggle count during each scan cycle starting from one. For the scan cycles number greater than the chain length the unload toggle count is zero. It can be seen that these values exactly match up to the values in the "unload toggles" column of the original data set in FIG. 3.

Therefore, the above-described embodiments provide a very fast and efficient approach to determining the load and unload toggle counts without requiring simulation to be performed.

Figure 8:
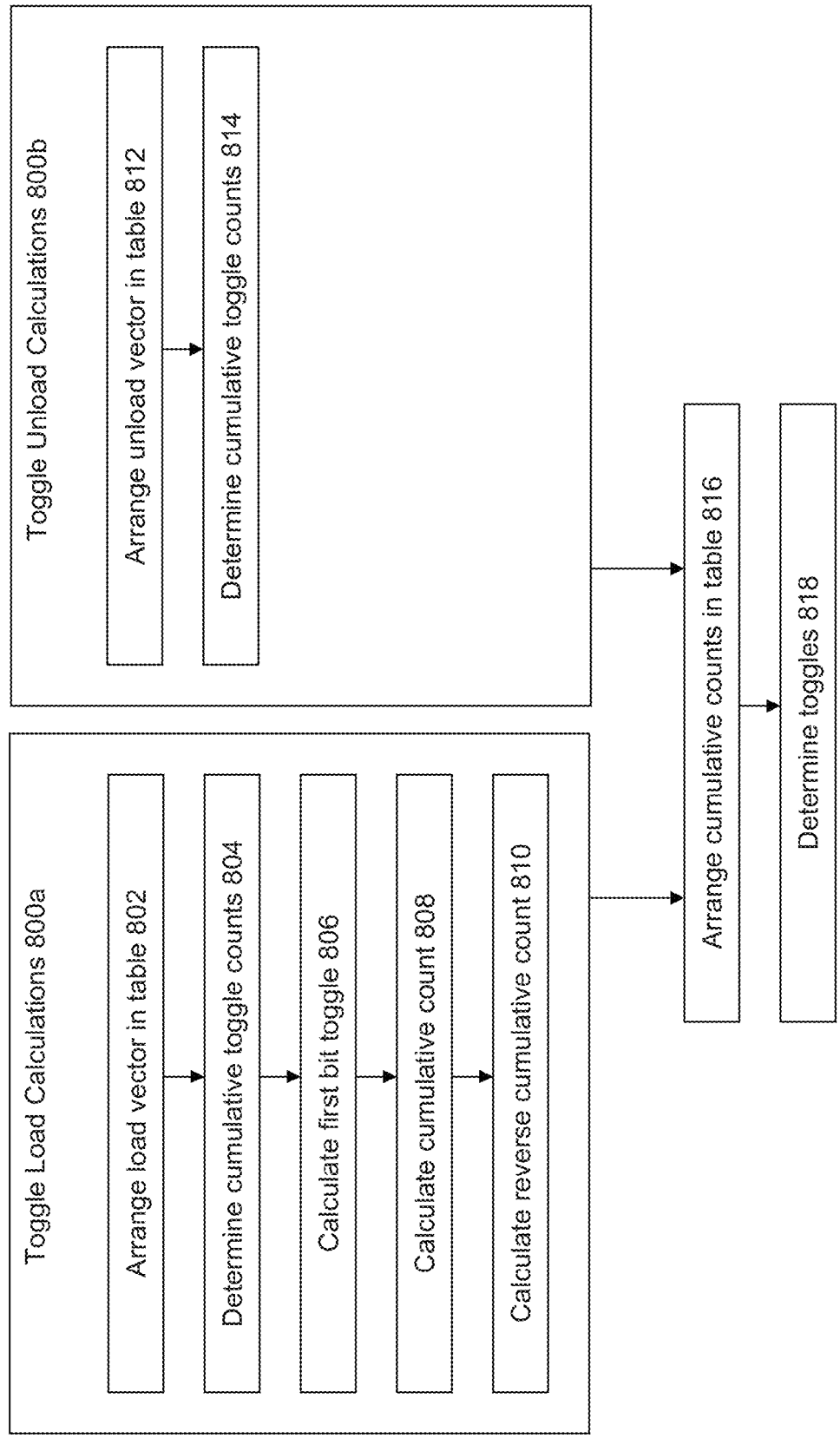
FIG. 8 shows a flowchart of a process for performing toggle count analysis according to some embodiments of the invention.

FIG. 8 shows a flowchart of a process for determining a total toggle count for each flop during a scan shift phase. As before, the input data for these processes are the load and unload test vectors for the scan chain. This process will be illustratively explained using the tables of FIGS. 9-11, using the example test vector data that was previously presented in FIG. 3.

Toggle load calculations are performed at 800a to generate intermediate load toggle data based upon the load vector. At 802, the load vector is arranged in a tabular column, e.g., as shown in column B of FIG. 9. At 804, the cumulative toggle count is calculated and placed into another tabular column, as shown in column C of FIG. 9. At this point, the values in columns B and C in FIG. 9 exactly correspond to the values in columns B and C that were obtained in FIG. 5.

At 806, the first bit toggles are calculated for the load vector, e.g., using the approach described above with respect to FIG. 4. In FIG. 9, the first bit toggle values are placed into column D of the table. The reason this value is different from the approach described above with regard to FIG. 4 is that the other algorithm is for calculating load toggles, which is for each scan cycle and represents a column in the table. In contrast, the present algorithm is calculating flop toggles, which is actually a row in the simulation table. The first bit toggle impacts only for scan cycles number until the length of scan chain; however for flop toggles, it affects each flop, e.g., the first bit toggle is actually passing though each flop.

A new cumulative count is obtained by adding previous cumulative count to the first bit toggle value for each scan cycle (808). This is shown in column E of FIG. 9, in which the value for each row in column E is based upon a sum of the respective values for that row in columns C and D.

Next, at 810, the order of the cumulative toggle count is reversed for the load vector such that the first value goes into last element and the last value moves into first element. This is illustrated in column F of FIG. 9.

At this point, the process for generating intermediate data for the toggle load values is complete. The process now proceeds to generate intermediate data for the toggle unload values.

Toggle unload calculations are performed at 800b to generate intermediate load toggle data based upon the unload vector. At 812, the unload vector is arranged in a tabular column, e.g., as shown in column I of FIG. 10. At 814, the cumulative toggle count is calculated and placed into another tabular column, as shown in column J of FIG. 10. At this point, the values in columns I and J in FIG. 10 exactly correspond to the values in columns I and J that were obtained in FIG. 7.

At this point, the process for generating intermediate data for the toggle unload values is complete and is ready to be combined with the intermediate data for the toggle load values.

At 816, the intermediate toggle load data and the intermediate toggle unload data are arranged, e.g., as shown in columns F and J, respectively, in FIG. 11. In particular, each row of the table in FIG. 11 corresponds to a different flop in the scan chain, as identified by the value in column G of the table. The reverse cumulative count data for the load toggles from column F of FIG. 9 is placed into column F of FIG. 11. The cumulative toggle count data for the unload toggles from column J of FIG. 10 is placed into column J of FIG. 11.

The total toggles can now be generated at 818 by adding the cumulative load and unload toggles counts to get flop toggles up to the chain length.

Flop_toggles[$i$]=Cumm_Load_Toggles[$i$]+Cumm_Unload_Toggles[$i$]

As shown in FIG. 11, a column K is created for the total flop toggle count, in which the length of this column equals the chain length. Each element corresponds to the total toggle for the corresponding flop in the scan chain. Therefore, the total flop toggle count for flop a is 4, the total is 3 for flop b, a total of 4 for flop c, and a total of 4 for flop d.

At this point, the total flop toggle count has been obtained. It is noted that the values shown in column K exactly correspond to the values in the "total flop toggles" in FIG. 3, showing that the present embodiment has accurately calculated these values without requiring simulation to be performed.

An approach will now be described to calculate an "at-one" count for each flop during a scan shift phase. The at-one count indicates the total number of times the scan flop is at the value "1" during the scan shift phase. This information can be used, for example, to generate the TCF (Toggle Count File) which is used by electronic design automation EDA tools to perform power analysis for an IC chip.

FIG. 12 illustrates at-one values for the test vector data presented in FIG. 3 and how this data is calculated if the entire test vector scan sequence is simulated. FIG. 12 shows a very similar table as previously presented in FIG. 3, except that the bottom row is labeled "total at-one count". The way values in this row is determined in simulation is by generating all of the scan cycle data shown in each of the rows labeled cycle 1 through cycle 6. Once that data has been created through simulation, then a count is made of each row that includes the value "1" for a particular flop. Here, for flop a, there are three rows (for cycles 2, 3, and 6) that have the value "1". Therefore, the value "3" is placed in the "a" column for the "total at-one count" row. For flop b, there are three rows (for cycles 1, 3, and 4) that have the value "1". As such, the value "3" is placed in the "b" column for the "total at-one count" row. For flop c, there are four rows (for cycles 1, 2, 4, and 5) that have the value "1". Therefore, the value "4" is placed in the "c" column for the "total at-one count" row. Finally, for flop d, there are four rows (for cycles 2, 3, 5, and 6) that have the value "1". Therefore, the value "4" is placed in the "d" column for the "total at-one count" row.

Figure 13:
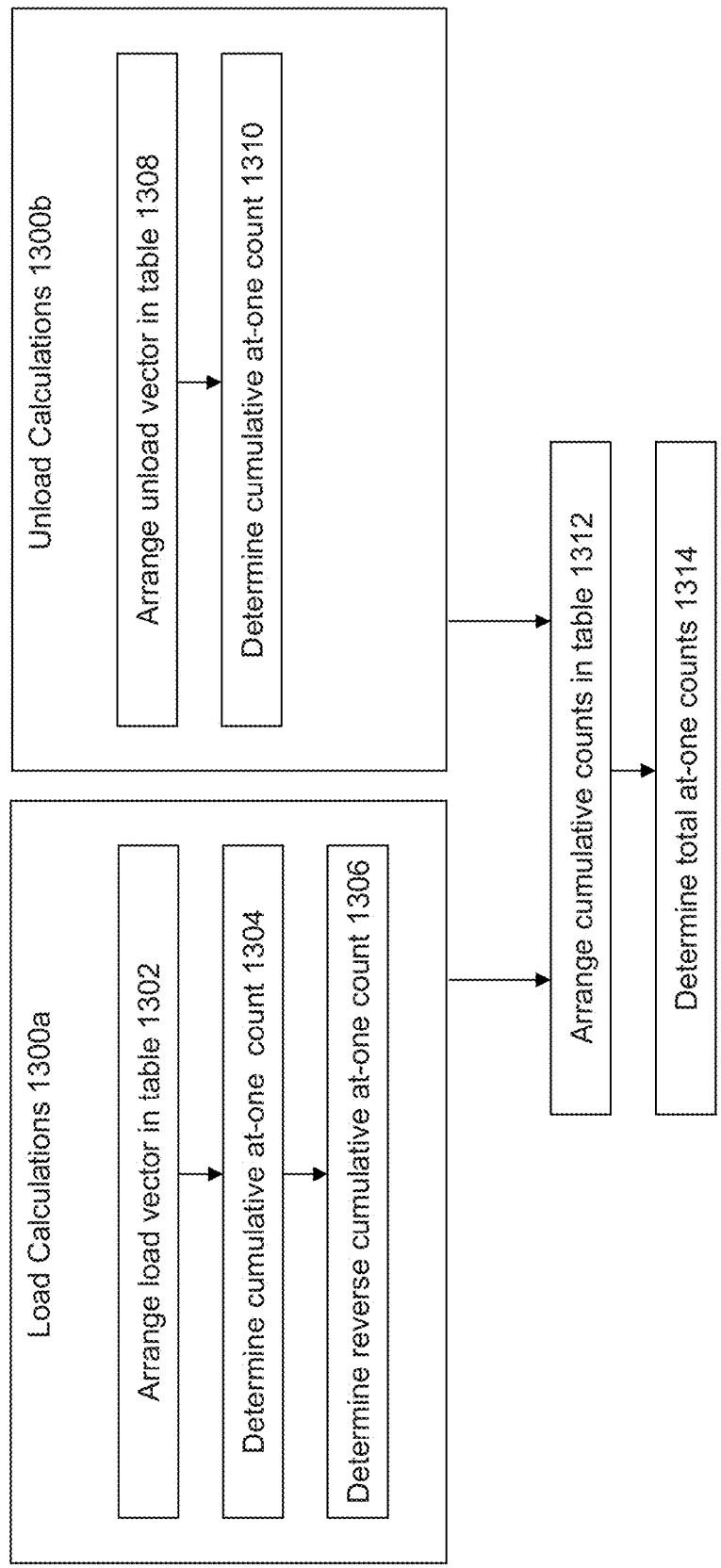
FIG. 13 shows a flowchart of a process for performing at-one count analysis according to some embodiments of the invention.

Embodiments of the invention provide an approach that quickly allows these values to be determined without having to undergo the expense of performing simulation. FIG. 13 shows a flowchart of a process for determining at-one counts according to some embodiments of the invention. According to some embodiments, the scan chain must be free of inverters. If there are inverters present, then the scan chains can be divided into subchains minus the inverters and this algorithm can be applied on the subchain. As before, the input data for these processes are the load and unload test vectors for the scan chain. This process will be illustratively explained using the tables of FIGS. 14-16, using the example test vector data that was previously presented in FIGS. 3 and 12.

Load vector calculations are performed at 1300$a$ to generate intermediate load vector data based upon the load vector. At 1302, the load vector is arranged in a tabular column, e.g., as shown in column B of FIG. 14.

At 1304, cumulative at-one counts are determined for the load vector data. The entry in this column is incremented for each value "1" that appears in the corresponding row in the load vector column. This is illustrated in column C of FIG. 14. For example, for row 1, the value of column B is "0"; therefore, the at-one count in column C is "0". For row 2, the value in column B is "1". As such, the entry in column C is incremented since the value "1" has appeared in this row. At row 3, the value in column B is "1", which causes the entry in column C to be incremented from "1" to "2". For row 4, the value of column B is "0"; therefore, the at-one count in column C is not incremented and remains at a value of "2". At row 5, the value of column B is also "0"; therefore, the at-one count in column C is not incremented and remains at a value of "2". At row 5, the value of column B is "1"; therefore, the at-one count in column C is incremented from "2" to "3".

At 1306, the order of the cumulative toggle at-one count for the load vector is reversed such that the first value goes into last element and the last value moves into first element. In the example of FIG. 14, this reverse ordering is shown in column D.

At this point, the process for generating intermediate data for the load vector values is complete. The process then proceeds to generate intermediate data for the unload vector values.

Unload vector calculations are performed at 1300$b$ to generate intermediate unload vector data based upon the load vector. At 1308, the unload vector is arranged in a tabular column, e.g., as shown in column I of FIG. 15.

Next, at 1310, cumulative at-one counts are determined for the unload vector data. This is illustrated in FIG. 15, in which another column J is created for unload vector cumulative at-one count entries. The entry in this column is increased by one, every time a value "1" appears in the corresponding row in the unload vector column I. For example, for row 1, the value of column I is "1"; therefore, the at-one count in column J is incremented to "1". For row 2, the value in column I is "1". As such, the entry in column C is incremented from "1" to "2". For row 3, the value of column I is "0"; therefore, the at-one count in column J is not incremented and remains at a value of "2".

It is important to note that in one embodiment, for the last element, this value is not incremented irrespective of presence of value 1 for the last flop of the unload vector. Therefore, even though the value in column I is "1" for row 4, the cumulative at-one count for this row is not incremented and remains at a value of "2".

At this point, the process for generating intermediate data for the unload vector is complete and is ready to be combined with the intermediate data for the load vector.

At 1312, the intermediate load vector data and the intermediate unload vector data are arranged, e.g., as shown in columns D and J, respectively, in FIG. 16.

At 1314, the total at-one counts are determined based upon the intermediate load vector and unload vector data. As shown in FIG. 16, another column K is created for the total at-one counts. The length of this new column K equals the chain length. Each element corresponds to the total 'At-One' counts for the corresponding flop in the scan chain.

For the first element, the entry in column K equals the load vector cumulative at-one count for the first element. In FIG. 16, this means that the row corresponding to flop a has a value "3" in column K, based upon using the value "3" that appears in column D and ignoring the value in column J.

For rest of the elements through to the chain length, the total at-one count is obtained using the following:

For $i$=1

Total_At-One[$i$]=Cumm_Load_At-One[$i$]

For i/=1

Total_At-One[i]=Cumm_Load_At-One[i]+Cumm_Unload_At-One [i−1]

For the row corresponding to flop b, this means that the value of column K is obtained by adding the value in column D for flop b (i.e., value of "2") with the value of column J for the previous row for flop a (i.e., value of "1") to obtain the value "3" that is entered into column K.

For the row corresponding to flop c, the value of column K is similarly obtained by adding the value in column D for flop c (i.e., value of "2") with the value of column J for the previous row for flop b (i.e., value of "2") to obtain the value "4" that is entered into column K. For the row corresponding to flop d, the value of column K is obtained by adding the value in column D for flop d (i.e., value of "2") with the value of column J for the previous row for flop c (i.e., value of "2") to obtain the value "4" that is entered into column K.

It can be seen that the total at-one counts in column K corresponds exactly to the values shown in FIG. 12. These values were obtained, however, merely by analyzing the load and unload vectors and do not require simulation to be performed to generate all bits for each scan chain for each scan cycle.

Therefore, what has been described is an improved approach for analyzing test vectors to perform toggle analysis.

System Architecture Overview

Figure 17:
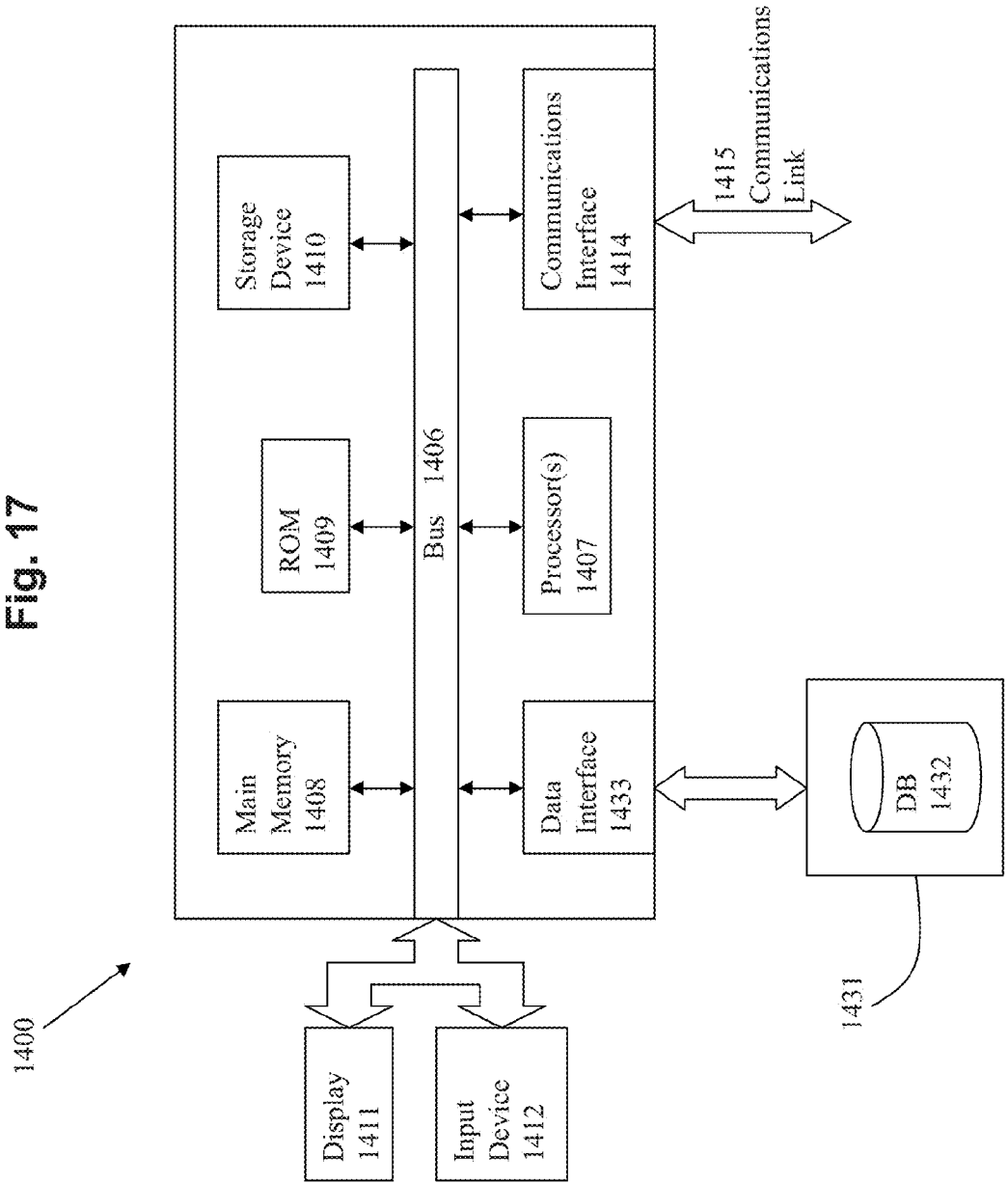
FIG. 17 depicts a computerized system on which a method for re-using digital assertions in a mixed signal context can be implemented.

FIG. 17 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for analyzing test vectors that is implemented with a processor, comprising:
using at least the processor to perform a process, the process comprising:
identifying at least a part of a scan chain that comprises at least one inverter;
identifying a load vector for the at least the part of the scan chain;
identifying an unload vector for the at least the part of the scan chain; and
performing toggle count calculations iteratively using first data of the load vector and second data of the unload vector by using at least information about a length of the scan chain, wherein the information about the length of the scan chain is used to reduce an intermediate cumulative toggle count during one or more iterations to determine a final toggle count with the load vector or the unload vector.

2. The method of claim 1, in which the toggle count calculations are performed to calculate load toggles.

3. The method of claim 2 further comprising:
arranging the load vector in a table;
determining cumulative toggle counts for the load vector;
performing a subtraction adjustment for an element along the at least the part of the scan chain based at least in part upon a position of the element in the at least the part of the scan chain;
calculating a first bit toggle; and
performing analysis to determine total load toggles based at least in part upon the cumulative toggle counts, subtraction adjustment, and first bit toggle.

4. The method of claim 1, in which the toggle count calculations are performed to calculate unload toggles.

5. The method of claim 4 further comprising:
arranging the unload vector in a table;

determining cumulative toggle counts for the unload vector; and performing analysis to determine total unload toggles based at least in part upon the cumulative toggle counts.

6. The method of claim 1, in which the toggle count calculations are performed to calculate a total toggle count.

7. The method of claim 6 further comprising:
performing toggle load calculations;
performing toggle unload calculations;
arranging cumulative counts from the toggle load calculations and toggle unload calculations; and
performing analysis to determine the total toggle count based at least in part upon the cumulative counts.

8. The method of claim 1, in which the toggle count calculations are performed for each scan cycle.

9. The computer implemented method of claim 1, the process further comprising:
identifying the at least one inverter in the at least the part of the scan chain; and
dividing the at least the part of the scan chain into a plurality of subchains.

10. The computer implemented method of claim 9, the process further comprising:
generating intermediate load vector data for the each of the plurality of subchains based at least in part upon the load vector;
cumulating the intermediate load vector data for the each of the plurality of subchains; and
performing the toggle calculations based at least in part upon the intermediate load vector data for the each of the plurality of subchains.

11. The computer implemented method of claim 10, the process further comprising:
generating intermediate unload vector data based at least in part upon the unload vector;
cumulating the intermediate unload vector data for the each of the plurality of subchains based at least in part upon a criterion; and
performing the toggle calculations based at least in part upon the intermediate unload vector data for the each of the plurality of subchains.

12. The computer implemented method of claim 11, in which the criterion comprises a scan cycle number and a total number of scan cycles.

13. A system for analyzing test vectors, comprising:
at least one processor; and
a memory for holding programmable code, wherein the programmable code includes instructions which, when executed by the at least one processor, cause the at least one processor to:
identify at least a part of a scan chain that comprises at least one inverter,
identify a load vector for the at least the part of the scan chain,
identify an unload vector for the at least the part of the scan chain, and
perform toggle count calculations iteratively using first data of the load vector and second data of the unload vector by using at least a length of the scan chain, wherein the information about the length of the scan chain is used to reduce an intermediate cumulative toggle count during one or more iterations to determine a final toggle count with the load vector or the unload vector.

14. The system of claim 13, in which the toggle count calculations are performed to calculate load toggles.

15. The system of claim 14, in which the programmable code further includes instructions to cause the at least one processor to:
arrange the load vector in a table;
determine cumulative toggle counts for the load vector;
perform a subtraction adjustment for an element along the at least the part of the scan chain based at least in part upon a position of the element in the at least the part of the scan chain and information about a length of the scan chain;
calculate a first bit toggle; and
perform analysis to determine total load toggles based at least in part upon the cumulative toggle counts, subtraction adjustment, and first bit toggle.

16. The system of claim 13, in which the toggle count calculations are performed to calculate unload toggles.

17. The system of claim 16 in which the programmable code further includes instructions to cause the at least one processor to arrange the unload vector in a table, to determine cumulative toggle counts for the unload vector, and to perform analysis to determine total unload toggles based at least in part upon the cumulative toggle counts.

18. The system of claim 13, in which the toggle count calculations are performed to calculate a total toggle count.

19. The system of claim 18 in which the programmable code further includes instructions for performing toggle load calculations, performing toggle unload calculations, arranging cumulative counts from the toggle load calculations and toggle unload calculations, and performing analysis to determine the total toggle count based at least in part upon the cumulative counts.

20. The system of claim 13, the programmable code including the instructions, which when executed by the at least one processor, cause the at least one processor to further identify the at least one inverter in the at least the part of the scan chain and to divide the at least the part of the scan chain into a plurality of subchains.

21. The system of claim 20, the programmable code including the instructions, which when executed by the at least one processor, cause the at least one processor to further generate intermediate load vector data for the each of the plurality of subchains based at least in part upon the load vector, to cumulate the intermediate load vector data for the each of the plurality of subchains, and to performing the toggle calculations based at least in part upon the intermediate load vector data for the each of the plurality of subchains.

22. The system of claim 21, the programmable code including the instructions, which when executed by the at least one processor, cause the at least one processor to further generate intermediate unload vector data based at least in part upon the unload vector, and to cumulate the intermediate unload vector data for the each of the plurality of subchains based at least in part upon a criterion, and to perform the toggle calculations based at least in part upon the intermediate unload vector data for the each of the plurality of subchains.

23. The system of claim 22, in which the criterion comprises a scan cycle number and a total number of scan cycles.

24. A computer program product that includes a non-transitory computer readable storage medium, the non-transitory computer readable storage medium comprising a plurality of computer instructions which, when executed by at least one processor, cause the at least one processor to execute a method for analyzing test vectors, the method comprising:
using the at least the processor to perform a process, the process comprising:
identifying at least a part of a scan chain that comprises at least one inverter;

identifying a load vector for the at least the part of the scan chain;

identifying an unload vector for the at least the part of the scan chain; and performing toggle count calculations iteratively using first data of the load vector and second data of the unload vector by using at least a length of the scan chain, wherein the information about the length of the scan chain is used to reduce an intermediate cumulative toggle count during one or more iterations to determine a final toggle count with the load vector or the unload vector.

25. The computer program product of claim 24, in which the toggle count calculations are performed to calculate load toggles.

26. The computer program product of claim 25 further comprising:

arranging the load vector in a table;

determining cumulative toggle counts for the load vector;

performing a subtraction adjustment for an element along the at least the part of the scan chain based at least in part upon a position of the element in the at least the part of the scan chain;

calculating a first bit toggle; and performing analysis to determine total load toggles based at least in part upon the cumulative toggle counts, subtraction adjustment, and first bit toggle.

27. The computer program product of claim 24, in which the toggle count calculations are performed to calculate unload toggles.

28. The computer program product of claim 27 further comprising:

arranging the unload vector in a table;

determining cumulative toggle counts for the unload vector; and performing analysis to determine total unload toggles based at least in part upon the cumulative toggle counts.

29. The computer program product of claim 24, in which the toggle count calculations are performed to calculate a total toggle count.

30. The computer program product of claim 29 further comprising:

performing toggle load calculations;

performing toggle unload calculations;

arranging cumulative counts from the toggle load calculations and toggle unload calculations; and performing analysis to determine the total toggle count based at least in part upon the cumulative counts.

* * * * *